(12) United States Patent
Gu et al.

(10) Patent No.: US 9,118,336 B2
(45) Date of Patent: Aug. 25, 2015

(54) PHYSICAL SYSTEM FOR CHIP-SCALE CPT ATOMIC CLOCK

(71) Applicant: WUHAN INSTITUTE OF PHYSICS AND MATHEMATICS, CHINESE ACADEMY OF SCIENCES, Wuhan (CN)

(72) Inventors: Sihong Gu, Wuhan (CN); Yi Zhang, Wuhan (CN); Suping Qu, Wuhan (CN); Xueming Shi, Wuhan (CN)

(73) Assignee: Wuhan Institute of Physics and Mathematics, Chinese Academy of Sciences, Wuhan (CN)

(*) Notice: Subject to any disclaimer, the term of this patent is extended or adjusted under 35 U.S.C. 154(b) by 0 days.

(21) Appl. No.: 14/451,405

(22) Filed: Aug. 4, 2014

(65) Prior Publication Data

US 2014/0347140 A1  Nov. 27, 2014

Related U.S. Application Data

(63) Continuation-in-part of application No. PCT/CN2012/078270, filed on Jul. 30, 2012.

(30) Foreign Application Priority Data

Feb. 15, 2012 (CN) .......................... 2012 1 0033807

(51) Int. Cl.
*G04F 5/14* (2006.01)
*H03L 7/26* (2006.01)
*G02B 27/28* (2006.01)
*H01S 1/06* (2006.01)

(52) U.S. Cl.
CPC ................ *H03L 7/26* (2013.01); *G02B 27/283* (2013.01); *G04F 5/145* (2013.01); *H01S 1/06* (2013.01)

(58) Field of Classification Search
CPC ............. G04F 5/14; G04F 5/145; H03L 7/26; H01S 1/06; G02B 27/283
USPC ...................................................... 331/94.1, 3
See application file for complete search history.

(56) References Cited

U.S. PATENT DOCUMENTS

| | | | |
|---|---|---|---|
| 5,136,261 A * | 8/1992 | Lewis | 331/94.1 |
| 7,102,451 B2 * | 9/2006 | Happer et al. | 331/94.1 |
| 8,605,282 B2 * | 12/2013 | Groswasser | 356/367 |
| 8,816,779 B2 * | 8/2014 | Lecomte et al. | 331/3 |
| 2009/0302957 A1 * | 12/2009 | Levi et al. | 331/94.1 |

* cited by examiner

*Primary Examiner* — Ryan Johnson
(74) *Attorney, Agent, or Firm* — Matthias Scholl P.C.; Matthias Scholl

(57) ABSTRACT

A physical system for a chip-scale coherent population trapping (CPT) atomic clock. The physical system includes: a vertical-cavity surface-emitting laser (VCSEL) device, a first polarizing beam splitter, a first λ/4 wave plate, a chip of an atomic vapor cell, a second λ/4 wave plate, a reflection device, a lens, a second polarizing beam splitter, and a photo detector. The first polarizing beam splitter, the first λ/4 wave plate, the chip of the atomic vapor cell, the second λ/4 wave plate, and the reflection device are disposed in sequence. The lens, the second polarizing beam splitter, and the photo detector are disposed in sequence.

7 Claims, 8 Drawing Sheets

PHYSICAL SYSTEM FOR CHIP-SCALE CPT ATOMIC CLOCK

CROSS-REFERENCE TO RELATED APPLICATIONS

This application is a continuation-in-part of International Patent Application No. PCT/CN2012/078270 with an international filing date of Jul. 30, 2012, designating the United States, now pending, and further claims priority benefits to Chinese Patent Application No. 201210033807.6 filed Feb. 15, 2012. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

1. Field of the Invention

The invention relates to the field of the atomic clocks, and more particularly to a physical system for a chip-scale coherent population trapping (CPT) atomic clock.

2. Description of the Related Art

Atomic clock is a tool that, to measure time, utilizes quantum transition between different energy levels in the microcosm of an atom.

The atomic clock provides frequency signals of high stability and high accuracy, which satisfy multiple requirements on timing and punctuality, navigation, precision measurement, and high-speed communication.

A physical system is a core part of the atomic clock. The quality of the physical system directly determines performances and indexes of the atomic clock. Thus, the design of the physical system is one of the key factors in making the atomic clock.

In a conventional physical system, an alkali metal atom and buffer gas in a bubble are heated to a temperature higher than the room temperature to produce alkali metal atom vapor. The buffer gas is an inactive gas such as nitrogen, methane, helium, or a mixture thereof. The buffer gas is used to narrow the line width, quench the fluorescence, and mix the energy levels. The alkali metal atom is cesium 133, rubidium 87, or rubidium 85.

Resonance between the ground-state hyperfine sublevels of the alkali metal atom is used to discriminate the frequency of the injected microwave. With reference to FIG. 1, because the two energy levels of $m_F=0$ ("0-0" energy levels) are not sensitive to a weak magnetic field, the transition frequency $\upsilon_{00}$ therebetween is generally used as a discrimination frequency of the atomic clock. When the microwave frequency is scanned through the transition frequency, the resonance signal represents a concave or a convex in the detected optical signal. A local oscillator is utilized to produce the microwave, and the microwave is locked in a center transition frequency corresponding to the concave or the convex of the resonance signal, thereby obtaining a precise clock signal output of the local oscillator.

Coherent population trapping (CPT) atomic clock is a more recent type of atomic clock that features small volume, low energy consumption, and fast start, and has broad application prospects. Principally, the CPT atomic clock is so far the only miniaturized atomic clock. A chip-scale CPT atomic clock can be realized by using the micro-electro-mechanical systems (MEMS) process to manufacture a quantum system and an application specific integrated circuit (ASIC) process to manufacture an electronics system.

A schematic diagram of a physical system of a passive bubble-type CPT atomic clock is shown in FIG. 2. A microwave of a certain power passes through a capacitor and is mixed into a DC current. The mixed electric signal is injected into a vertical-cavity surface-emitting laser (VCSEL) to produce multi-sideband of light, and a fundamental frequency of the multi-sideband of the light is controlled by the injected DC current and a temperature of a laser. The frequency difference between adjacent sidebands is equal to a microwave frequency. An intensity of each sideband of the light satisfies a Bessel function. CPT resonance is excited by the two sidebands.

If the $\pm1^{st}$ order sidebands of the light excite the CPT resonance, it is called a half-width modulated excitation. If the fundamental frequency (0 order) and $+1^{st}$ (or $-1^{st}$) order sidebands of the light excite the CPT resonance, it is called a full-width modulated excitation.

A quarter wave plate (($\lambda/4$ wave plate) functions in converting a linearly polarized light output by the VCSEL into a left-handed ($\sigma-$) or right-handed ($\sigma+$) circularly polarized light. The bubble is disposed in an environment where the temperature can be accurately controlled, the atom and the laser interact with each other so that an atom vapor is produced.

On the premise that the environmental magnetic field is shielded, solenoids (not shown in FIG. 2) arranged outside the bubble produce a magnetic field in parallel to a transmission direction of the light. A photo detector detects the laser passing through the bubble and converts the laser into a photocurrent signal. The injected DC current and the temperature of the laser tube are properly controlled such that the two CPT exciting sidebands of the light output by the VCSEL excite electric dipole transitions (D1 line or D2 line transition) from two ground states to the same excited states. The microwave frequency is regulated to change the frequency difference between the two sidebands of the light. When the frequency difference is scanned through the resonance frequency of the hyperfine energy levels "0-0", a resonance signal emerges in the photocurrent output by the photo detector. The resonance signal is processed and a signal for feedback control of the microwave frequency is obtained. After a closed-loop control, a precise clock signal output of the local oscillator is obtained.

In the above-described conventional CPT atomic clock a single $\sigma-$ or $\sigma+$ circularly polarized laser serves as the light source to excite atom transitions. However, such a scheme is disadvantageous in that the atom is prone to be accumulated at ground-state magnetic sublevels having a minimum (or maximum) magnetic quantum due to an optical pumping effect of the circularly polarized laser on magnetic hyperfine splitting atomic sublevels. Such magnetic sublevels have no contribution to the CPT dark state, thereby being called polarized dark state. The phenomenon is illustrated in FIG. 1. Thus, the signal contrast (a ratio between an amplitude of the photocurrent signal increased by CPT resonance and an amplitude of the photocurrent signal of non-resonance) is not high and the stability of the CPT atomic clock is not high.

The above polarized black state can be eliminated by adopting a scheme including exciting the CPT resonance by orthogonal circularly polarization and using the $\sigma-$ and $\sigma+$ circularly polarized light to interact with the atom, so that a CPT signal having high contrast is obtained. The scheme can be illustrated in a four-energy-level drawing showing interaction between the light and the atom, as shown in FIG. 3. A phase difference between the $\sigma-$ and $\sigma+$ circularly polarized light is regulated to be (2n+1)π (n represents an integer) by time or space delay, and the in-phase superposition effect of the state function is achieved, so that the CPT resonance signal is enhanced and the atom is centralized at the "0-0 energy level", as shown in FIG. 4. Thus, the short term stability of the atomic clock manufactured by using the scheme of the CPT resonance excitation by orthogonal circularly polarization is higher than the conventional CPT atomic clock.

SUMMARY OF THE INVENTION

In view of the above-described problems, it is one objective of the invention to provide a physical system for a chip-scale CPT atomic clock that is adapted to centralize the atomic at the "0-0 energy level", enhance CPT resonance signal, and improve the signal-to-noise ratio and the contrast ratio. Besides, all components of the system are suitable for integration, thereby realizing miniaturization of passive CPT atomic clock.

To achieve the above objective, in accordance with one embodiment of the invention, there is provided a physical system for a chip-scale CPT atomic clock, the system comprising: a vertical-cavity surface-emitting laser (VCSEL) device, a first polarizing beam splitter, a first λ/4 wave plate, a chip of an atomic vapor cell, a second λ/4 wave plate, a reflection device, a lens, a second polarizing beam splitter, and a photo detector. The first polarizing beam splitter, the first λ/4 wave plate, the chip of the atomic vapor cell, the second λ/4 wave plate, and the reflection device are disposed in sequence. The lens, the second polarizing beam splitter, and the photo detector are disposed in sequence. A linearly polarized circular divergent beam is sent out by the VCSEL device and goes through the first polarizing beam splitter to produce a first linearly polarized circular divergent beam. The first linearly polarized circular divergent beam goes through the first λ/4 wave plate to produce a circularly polarized circular divergent beam. The circularly polarized circular divergent beam goes through the chip of the atomic vapor cell and the second λ/4 wave plate respectively to produce a second linearly polarized circular divergent beam. The second linearly polarized circular divergent beam is reflected by the reflection device to produce a first linearly polarized reflected circular divergent beam. The first linearly polarized reflected circular divergent beam goes through the lens to produce a first linearly polarized parallel beam. The first linearly polarized parallel beam is reflected by the second polarizing beam splitter to produce a first linearly polarized reflected parallel beam. The first linearly polarized reflected parallel beam is reflected by the first polarizing beam splitter and combined with the first linearly polarized circular divergent beam. The first linearly polarized reflected parallel beam after being reflected by the first polarizing beam splitter goes through the first λ/4 wave plate, the chip of the atomic vapor cell, the second λ/4 wave plate, respectively, is reflected by the reflection device, goes through the lens, the second polarizing beam splitter, respectively, and is transmitted to the photo detector and converted into a current output.

In a class of this embodiment, the VCSEL device comprises: a capacitance, an inductance, and a VCSEL. One end of the capacitance is used to input a microwave, and the other end of the capacitance is connected to an anode of the VCSEL. One end of the inductance is used to input a current, and the other end of the inductance is connected to the anode of the VCSEL. A cathode of the VCSEL is electrically grounded.

In a class of this embodiment, the reflection device comprises: a first 45° reflection surface and a second 45° reflection surface. The second linearly polarized circular divergent beam is reflected by the first 45° reflection surface to produce a second linearly polarized reflected circular divergent beam. The second linearly polarized reflected circular divergent beam is reflected by the second 45° reflection surface to produce the first linearly polarized reflected circular divergent beam.

In a class of this embodiment, an incident angle of the second linearly polarized circular divergent beam is 45°; and the first 45° reflection surface is perpendicular to the second 45° reflection surface.

In a class of this embodiment, beam centers of the linearly polarized circular divergent beam, the first linearly polarized circular divergent beam, the circularly polarized circular divergent beam, and the second linearly polarized circular divergent beam overlap with each other. Both the second linearly polarized reflected circular divergent beam and the first linearly polarized reflected parallel beam are perpendicular to a transmission direction of the linearly polarized circular divergent beam. The linearly polarized circular divergent beam, the first linearly polarized circular divergent beam, the circularly polarized circular divergent beam, the second linearly polarized circular divergent beam, the second linearly polarized reflected circular divergent beam, the first linearly polarized reflected circular divergent light, the first linearly polarized parallel beam, and the first linearly polarized reflected parallel beam are disposed on the same plane.

In a class of this embodiment, a transmission direction of the linearly polarized circular divergent beam is a positive direction of an X-axis. An opposite direction of the positive direction of the X-axis is a negative direction of the X-axis. Both an inclined surface of the first polarizing beam splitter and the second 45° reflection surface are inclined by clockwise rotating the negative direction of the X-axis for 45°. Both an inclined surface of the second polarizing beam splitter and the first 45° reflection surface are inclined by counterclockwise rotating the positive direction of the X-axis for 45°. A transmission direction of the second linearly polarized reflected circular divergent beam is a positive direction of a Y-axis. An angle between an optical axis of the first λ/4 wave plate and the positive direction of the Y-axis is 45°. An optical axis of the second λ/4 wave plate is in parallel to the optical axis of the first λ/4 wave plate.

In a class of this embodiment, a total optical path of the first linearly polarized circular divergent beam, the circularly polarized circular divergent beam, the second linearly polarized circular divergent beam, the second linearly polarized reflected circular divergent beam, the first linearly polarized reflected circular divergent light, the first linearly polarized parallel beam, and the first linearly polarized reflected parallel beam is $c/2v_{00}$, in which, c represents a light velocity in vacuum, and $v_{00}$ represents a transition frequency between two atomic ground-state hyperfine Zeeman levels having magnetic quantum numbers equivalent to zero in the chip of the atomic vapor cell.

Advantages according to embodiments of the invention are summarized as follows:

1. The system of the invention is adapted to centralize the atomic at the "0-0 energy level", thereby enhancing the CPT resonance signal and increasing the signal-to-noise ratio and the contrast ratio.

2. The light source and the detector can be integrated on the same silicon chip, so that the system is much miniaturized.

BRIEF DESCRIPTION OF THE DRAWINGS

The invention is described hereinbelow with reference to the accompanying drawings, in which.

Figure 1:
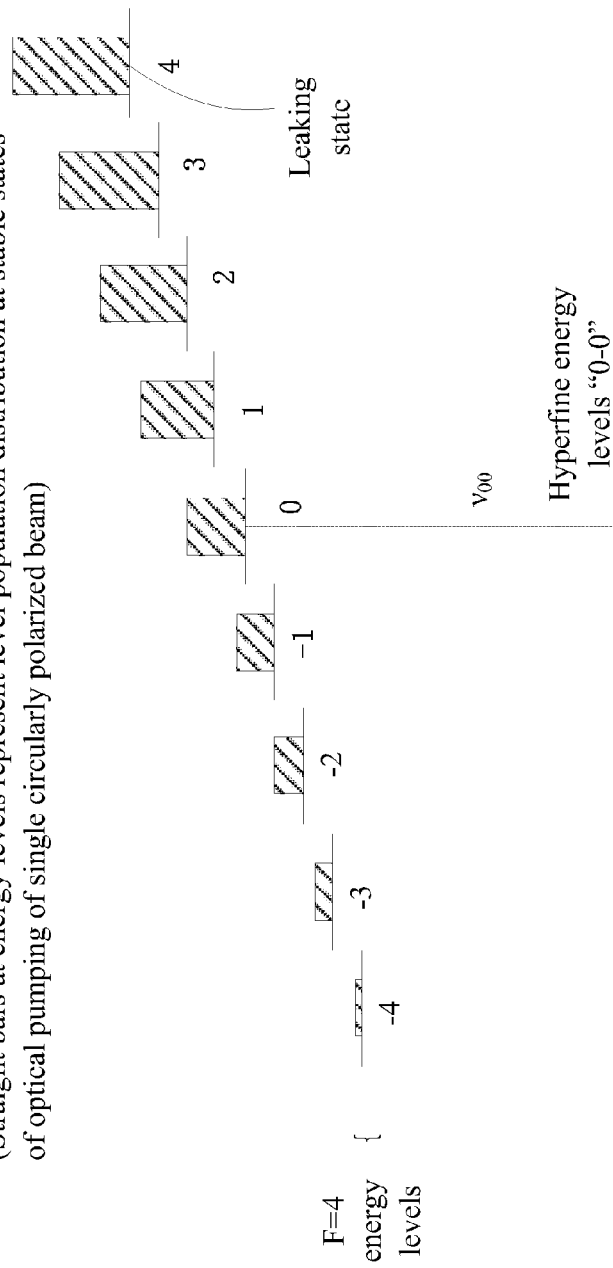
FIG. 1 is a Zeeman level population diagram of a ground-state hyperfine structure of an alkali metal atom pumped by a single circularly polarized beam (taken a representative cesium 133 pumped by a right-handed polarized beam as an example, straight bars at energy levels represent level population distribution at stable states of optical pumping of single circularly polarized beam)
Figure 2:
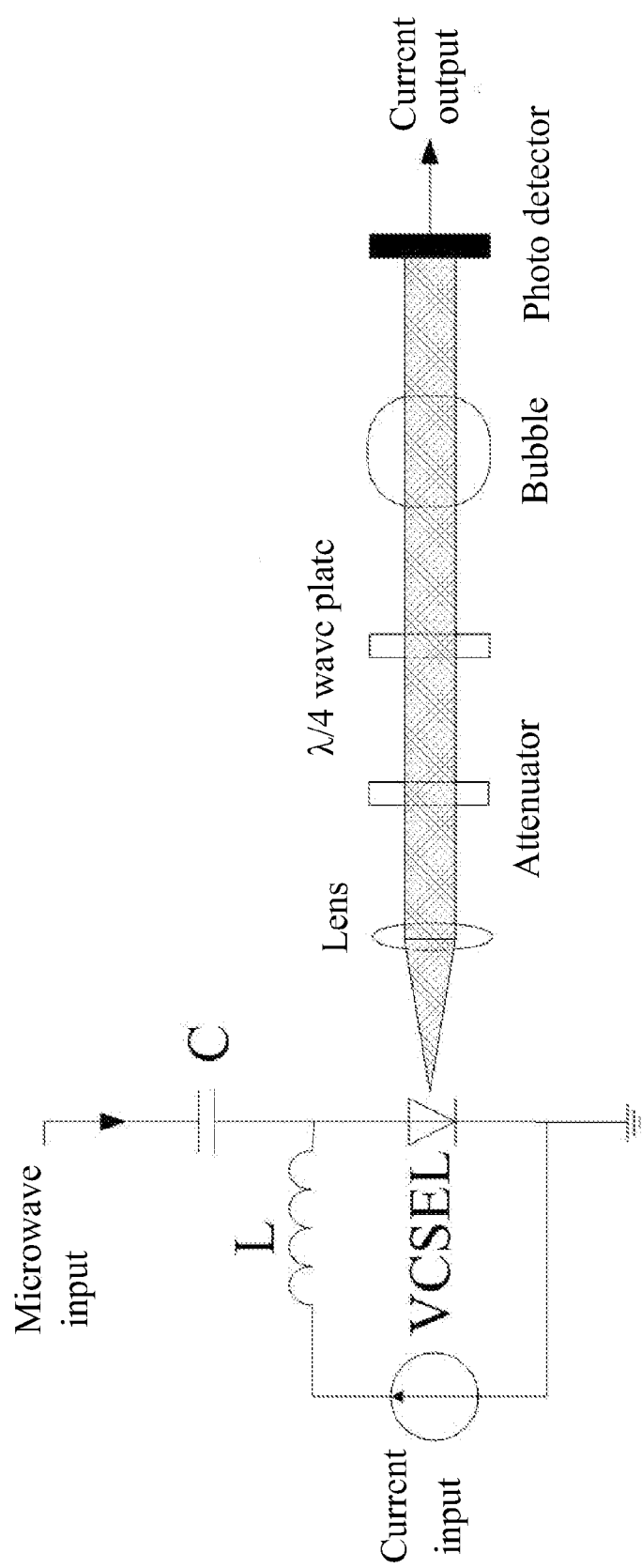
FIG. 2 is a schematic diagram of physical system for a conventional passive CPT atomic clock.
Figure 3:
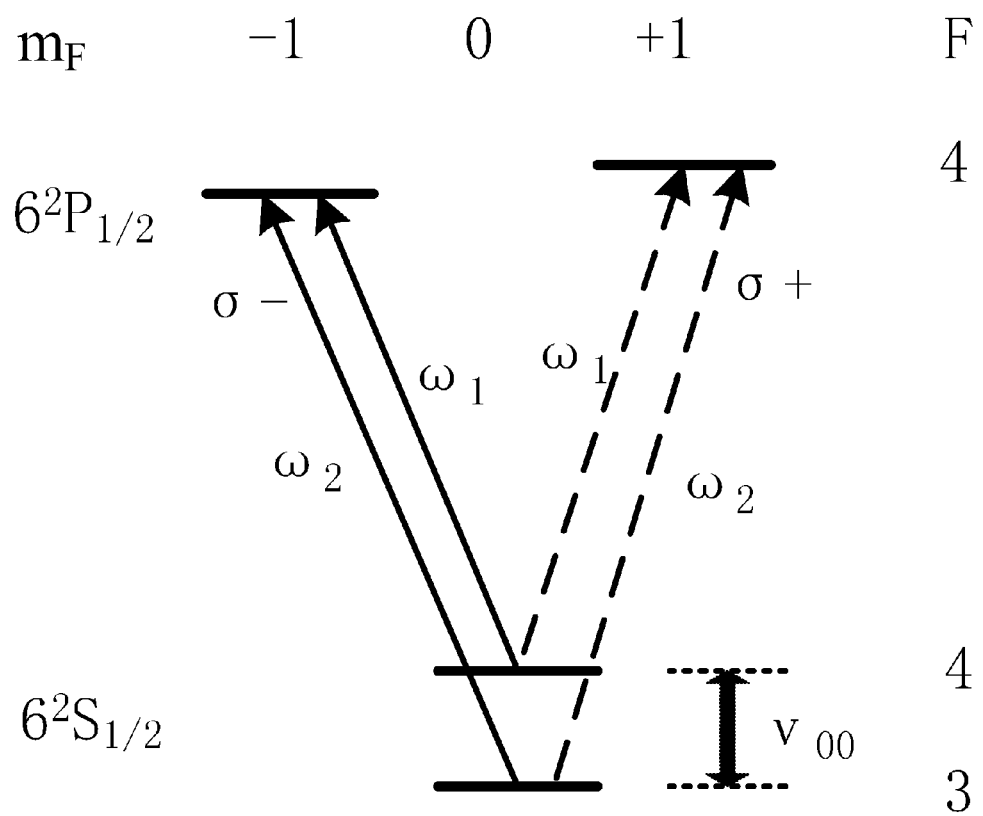
FIG. 3 is a four-energy level pumping diagram in a scheme of CPT excitation by orthogonal circularly polarization (taken a representative cesium 133 atom as an example)
Figure 4:
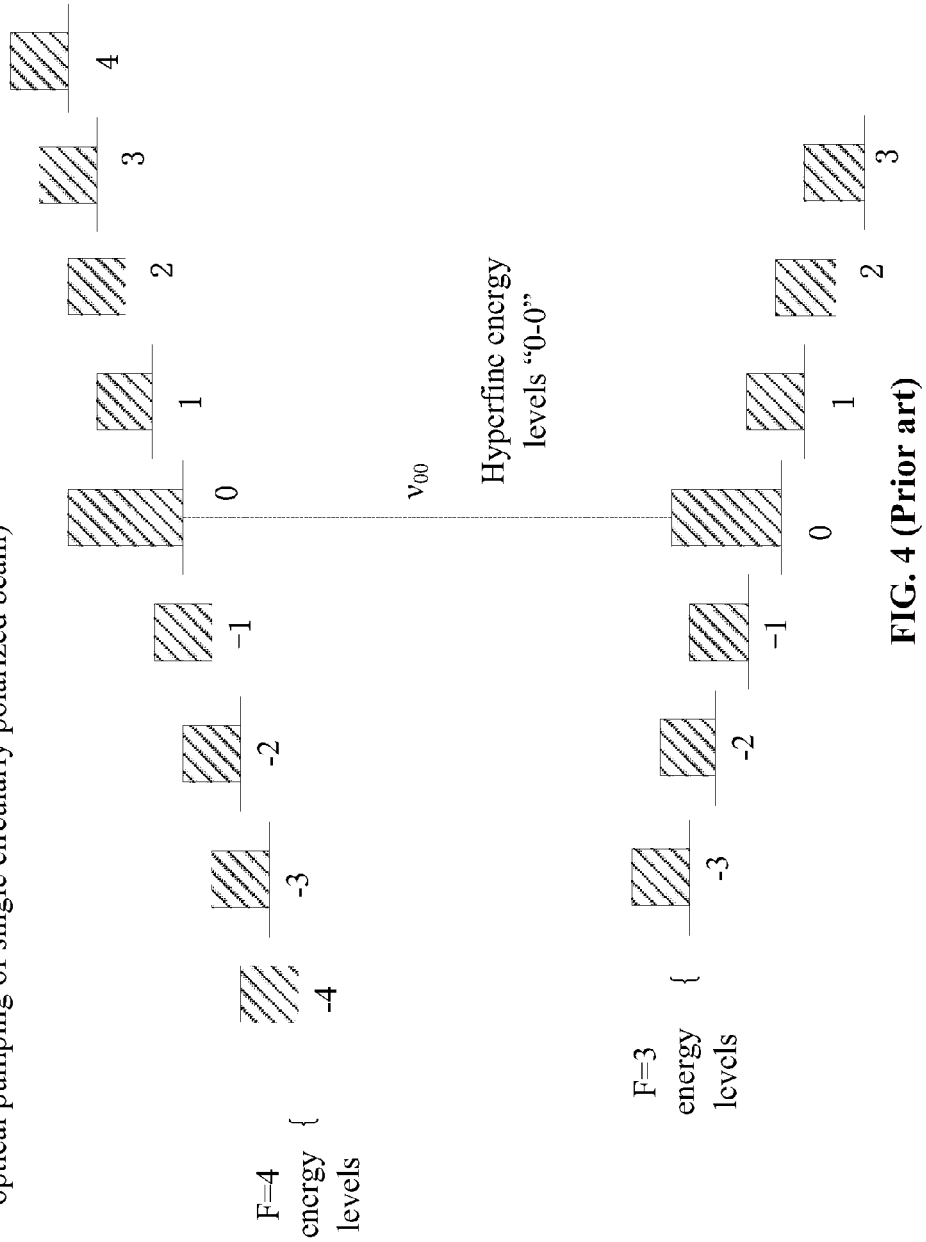
FIG. 4 is a Zeeman level population diagram of a ground-state hyperfine structure of an alkali metal atom in a scheme of CPT excitation by orthogonal circularly polarization (taken a representative cesium 133 as an example, straight bars at energy levels represent level population distribution at stable states of optical pumping of the orthogonal circularly polarization)
Figure 5:
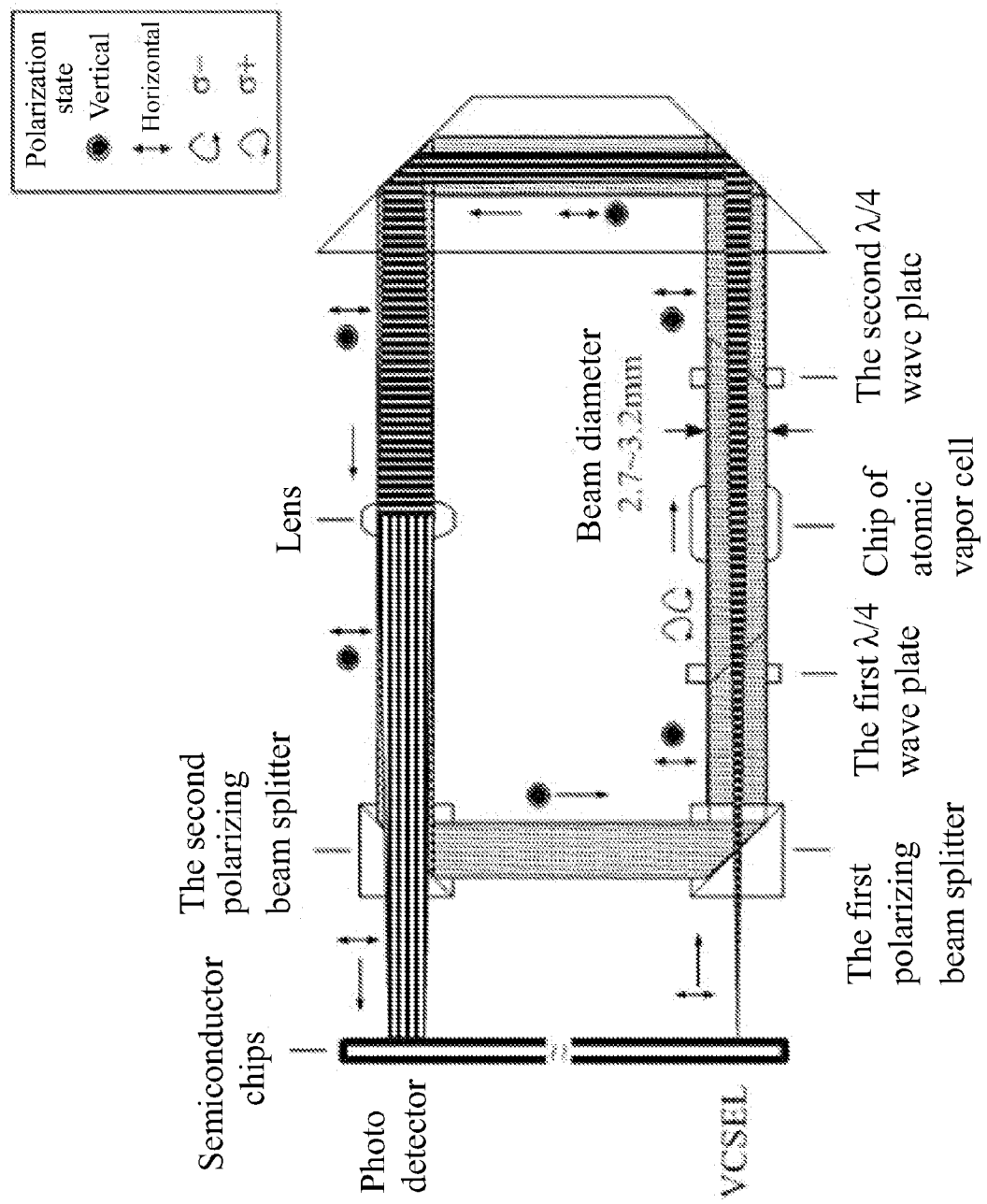
FIG. 5 is a schematic diagram of a physical system for a CPT atomic clock in accordance with one embodiment of the invention.

In the drawings, the following reference numbers are used: 1. Microwave input; 2. Current input; 3. Capacitance; 4. Inductance; 5. Vertical-cavity surface-emitting laser (VCSEL); 6a. First polarizing beam splitter; 6b. Second polarizing beam splitter; 7a. First λ/4 wave plate; 7b. Second λ/4 wave plate; 8. Chip of atomic vapor cell; 9a. First 45° reflection surface of trapezoidal prism; 9b. Second 45° reflection surface of trapezoidal prism; 10. Lens; 11. Photo detector; 12a. Linearly polarized circular divergent beam; 12b. First linearly polarized circular divergent beam; 12c. Circularly polarized circular divergent beam; 12d. Second linearly polarized circular divergent beam; 12e. Second linearly polarized reflected circular divergent beam; 12f. First linearly polarized reflected circular divergent beam; 12g. First linearly polarized parallel beam; and 12h. First linearly polarized reflected parallel beam.

DETAILED DESCRIPTION OF THE EMBODIMENTS

For further illustrating the invention, experiments detailing a physical system for a chip-scale CPT atomic clock are described below. It should be noted that the following examples are intended to describe and not to limit the invention.

Figure 7:
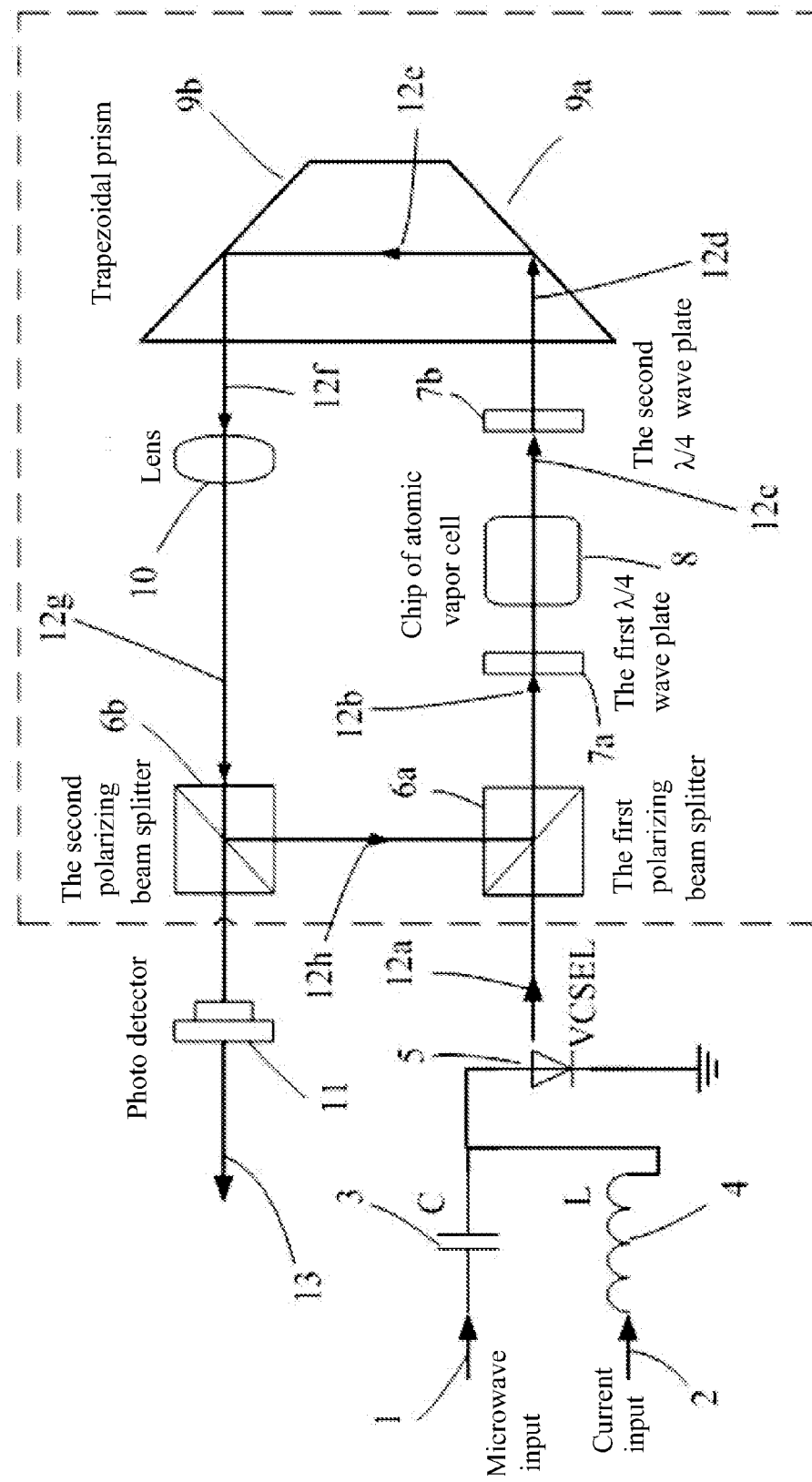
FIG. 7 is a structure diagram of a physical system for a CPT atomic clock in accordance with one embodiment of the invention.
Figure 8:
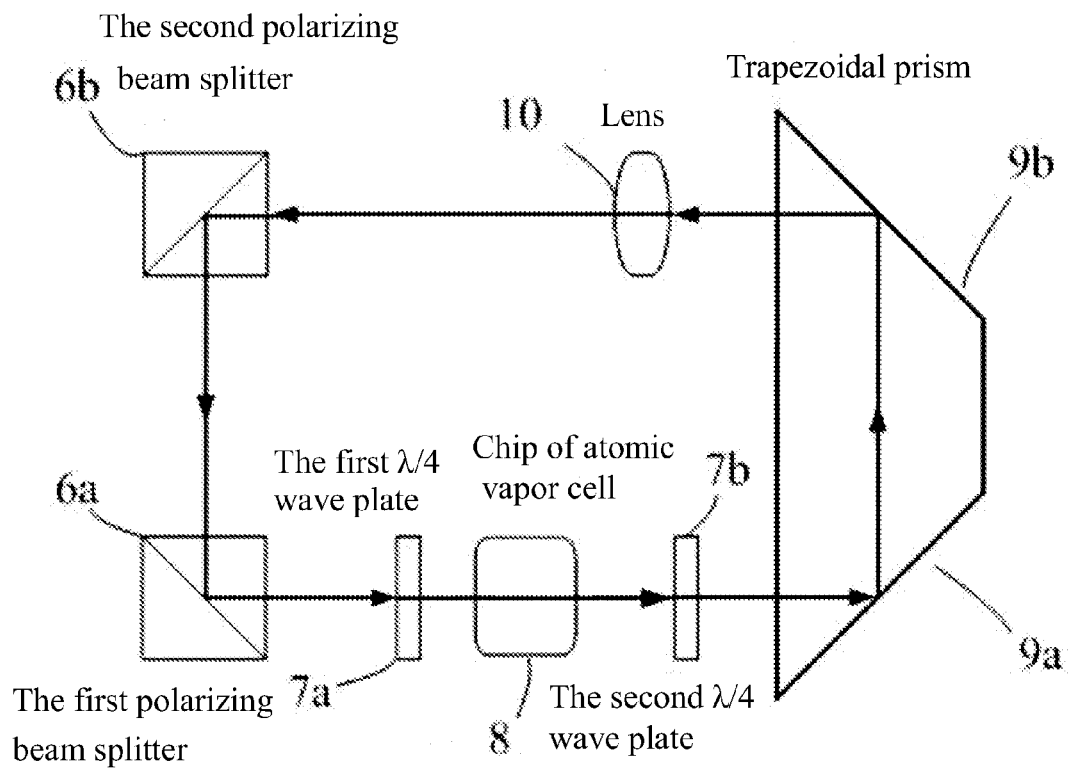
FIG. 8 is a schematic diagram of a time delay loop in accordance with one embodiment of the invention.

As shown in FIG. 7, a physical system for a chip-scale CPT atomic clock comprises: a VCSEL device, a first polarizing beam splitter 6a, a first λ/4 wave plate 7a, a chip 8 of an atomic vapor cell, a second λ/4 wave plate 7b, a reflection device, a lens 10, a second polarizing beam splitter 6b, and a photo detector 11. The first polarizing beam splitter 6a, the first λ/4 wave plate 7a, the chip 8 of the atomic vapor cell, the second λ/4 wave plate 7b, and the reflection device are disposed in sequence. The lens 10, the second polarizing beam splitter 6b, and the photo detector 11 are disposed in sequence. A linearly polarized circular divergent beam 12a is sent out by the VCSEL device and goes through the first polarizing beam splitter 6a to produce a first linearly polarized circular divergent beam 12b. The first linearly polarized circular divergent beam 12b goes through the first λ/4 wave plate 7a to produce a circularly polarized circular divergent beam 12c. The circularly polarized circular divergent beam 12c goes through the chip 8 of the atomic vapor cell and the second λ/4 wave plate 7b respectively to produce a second linearly polarized circular divergent beam 12d. The second linearly polarized circular divergent beam 12d is reflected by the reflection device to produce a first linearly polarized reflected circular divergent beam 12f. The first linearly polarized reflected circular divergent beam 12f goes through the lens 10 to produce a first linearly polarized parallel beam 12g. The first linearly polarized parallel beam 12g is reflected by the second polarizing beam splitter 6b to produce a first linearly polarized reflected parallel beam 12h. The first linearly polarized reflected parallel beam 12h is reflected by the first polarizing beam splitter 6a and combined with the first linearly polarized circular divergent beam 12b. The first linearly polarized reflected parallel beam 12h after being reflected by the first polarizing beam splitter 6a goes through the first λ/4 wave plate 7a, the chip 8 of the atomic vapor cell, the second λ/4 wave plate 7b, respectively, is reflected by the reflection device, goes through the lens 10, the second polarizing beam splitter 6b, respectively, and is transmitted to the photo detector 11 and converted into a current output.

A VCSEL 5 of the VCSEL device sends out the linearly polarized circular divergent beam 12a. The linearly polarized circular divergent beam 12a goes through the first polarizing beam splitter 6a to produce the first linearly polarized circular divergent beam 12b. The first linearly polarized circular divergent beam 12b goes through the first λ/4 wave plate 7a to produce the circularly polarized circular divergent beam 12c. The circularly polarized circular divergent beam 12c goes through the chip 8 of the atomic vapor cell and the second λ/4 wave plate 7b respectively to produce the second linearly polarized circular divergent beam 12d. The second linearly polarized circular divergent beam 12d is reflected by the reflection device to produce the first linearly polarized reflected circular divergent beam 12f. The first linearly polarized reflected circular divergent beam 12f goes through the lens 10 to produce the first linearly polarized parallel beam 12g. A distance between a light-emitting surface of the VCSEL 5 and the lens is equal to a fixed focal length of the lens. The lens is disposed on a position of the optical path after being reflected by the reflection device, thereby decreasing the volume of the physical system by the reflection.

The VCSEL 5 and the photo detector 11 are integrated on a chip, thereby decreasing the volume of the physical system compared with the conventional physical system.

The VCSEL device comprises: a capacitance 3, an inductance 4, and the VCSEL 5. One end of the capacitance 3 is used to input a microwave, and the other end of the capacitance 3 is connected to an anode of the VCSEL 5. One end of the inductance 4 is used to input a current, and the other end of the inductance 4 is connected to the anode of the VCSEL 5. A cathode of the VCSEL 5 is electrically grounded.

The reflection device comprises: a first 45° reflection surface 9a and a second 45° reflection surface 9b. The second linearly polarized circular divergent beam 12d is reflected by the first 45° reflection surface 9a to produce a second linearly polarized reflected circular divergent beam 12e. The second linearly polarized reflected circular divergent beam 12e is reflected by the second 45° reflection surface 9b to produce the first linearly polarized reflected circular divergent beam 12f.

An incident angle of the second linearly polarized circular divergent beam 12d is 45°. The first 45° reflection surface 9a is perpendicular to the second 45° reflection surface 9b.

Beam centers of the linearly polarized circular divergent beam 12a, the first linearly polarized circular divergent beam 12b, the circularly polarized circular divergent beam 12c, and the second linearly polarized circular divergent beam 12d overlap with each other. Both the second linearly polarized reflected circular divergent beam 12e and the first linearly polarized reflected parallel beam 12h are perpendicular to a transmission direction of the linearly polarized circular divergent beam 12a. The linearly polarized circular divergent beam 12a, the first linearly polarized circular divergent beam 12b, the circularly polarized circular divergent beam 12c, the second linearly polarized circular divergent beam 12d, the second linearly polarized reflected circular divergent beam 12e, the first linearly polarized reflected circular divergent light 12f, the first linearly polarized parallel beam 12g, and the first linearly polarized reflected parallel beam 12h are disposed on the same plane.

A transmission direction of the linearly polarized circular divergent beam 12a is a positive direction of an X-axis. An opposite direction of the positive direction of the X-axis is a negative direction of the X-axis. Both an inclined surface of the first polarizing beam splitter 6a and the second 45° reflection surface 9b are inclined by clockwise rotating the negative direction of the X-axis for 45°. Both an inclined surface of the second polarizing beam splitter 6b and the first 45° reflection surface 9a are inclined by counterclockwise rotating the positive direction of the X-axis for 45°.

A transmission direction of the second linearly polarized reflected circular divergent beam 12e is a positive direction of a Y-axis. An angle between an optical axis of the first λ/4 wave plate 7a and the positive direction of the Y-axis is 45°. An optical axis of the second λ/4 wave plate 7b is in parallel to the optical axis of the first λ/4 wave plate 7a.

A total optical path of the first linearly polarized circular divergent beam 12b, the circularly polarized circular divergent beam 12c, the second linearly polarized circular divergent beam 12d, the second linearly polarized reflected circular divergent beam 12e, the first linearly polarized reflected circular divergent light 12f, the first linearly polarized parallel beam 12g, and the first linearly polarized reflected parallel beam 12h is $$\frac{c}{2v_{00}},$$

in which, c represents a light velocity in vacuum, and $v_{00}$ represents a transition frequency between two atomic ground-state hyperfine Zeeman levels having magnetic quantum numbers equivalent to zero in the chip of the atomic vapor cell.

The transmission direction of the linearly polarized circular divergent beam 12a is the positive direction of the X-axis. The transmission direction of the second linearly polarized reflected circular divergent beam 12e is the positive direction of the Y-axis. The angle between an optical axis of the first λ/4 wave plate 7a and the positive direction of the Y-axis is 45°. The optical axis of the second λ/4 wave plate 7b is in parallel to the optical axis of the first λ/4 wave plate 7a. Thus, the linearly polarized beam in the direction of the Y-axis is converted into a magnetic left-handed (or right-handed) circularly polarized beam after passing through the first λ/4 wave plate 7a. The magnetic left-handed (or right-handed) circularly polarized beam is defined that a spinning direction of a photon is opposite to (the same as) a direction a quantization axis. Thus, an axial spinning angular momentum of the atom decreases (or increases) by h after absorbing a magnetic left-handed (or right-handed) circularly polarized beam.

Figure 6:
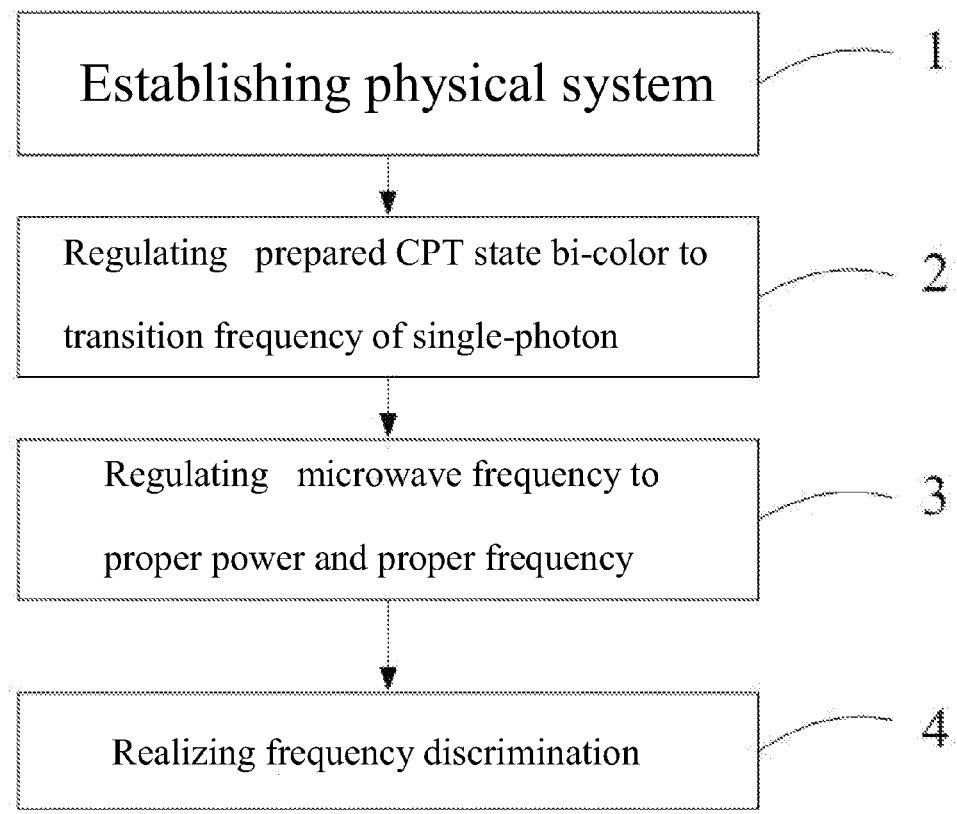
FIG. 6 is a flow chart for frequency discrimination in accordance with one embodiment of the invention.

As shown in FIG. 6, in a second step, similarly to the method of the conventional passive CPT atomic clock, a+1 order sideband of the light emitted by the VCSEL 5 is regulated to an electric dipole transition resonance between two energy levels of $|6^2 S_{1/2}, F=3\rangle$ and $|6^2 P_{1/2}, F=4\rangle$ of the cesium 133 atom. A −1 order sideband of the light is regulated to an electric dipole transition resonance between two energy levels of $|6^2 S_{1/2}, F=4\rangle$ and $|6^2 P_{1/2}, F=4\rangle$ of the cesium 133 atom.

As shown in FIG. 6, in a third step, a frequency of the microwave input 1 is scanned, a current output 13 of the photo detector 11 reflects an intensity of the CPT consonance. The current output 13 is a frequency discrimination signal of the microwave input 1, thereby realizing the frequency discrimination.

Compared with the conventional passive CPT atomic clock, the amplitude of the frequency discrimination signal of the CPT atomic clock of the invention is obviously larger, thereby being capable of improving the performance of the passive CPT atomic clock.

The above embodiment is one of the representative examples of the invention, it is obvious to those skills in the art to develop technical schemes using a combination of common knowledge, different alkali metal atoms (cesium 133, rubidium 87, and rubidium 85), different spectral lines (D1 and D2), and different modulation modes (half-width modulation and full-width modulation).

The system of the invention is adapted to centralize the atom at the "0-0 energy level", thereby enhancing the CPT consonance signal and increasing the signal-to-noise ratio and the contrast of the signal.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A physical system for a chip-scale coherent population trapping (CPT) atomic clock, the system comprising: a vertical-cavity surface-emitting laser (VCSEL) device, a first polarizing beam splitter, a first λ/4 wave plate, a chip of an atomic vapor cell, a second λ/4 wave plate, a reflection device, a lens, a second polarizing beam splitter, and a photo detector;
   wherein
      the first polarizing beam splitter, the first λ/4 wave plate, the chip of the atomic vapor cell, the second λ/4 wave plate, and the reflection device are disposed in sequence;
      the lens, the second polarizing beam splitter, and the photo detector are disposed in sequence;
      a linearly polarized circular divergent beam is sent out by the VCSEL device and goes through the first polarizing beam splitter to produce a first linearly polarized circular divergent beam;
      the first linearly polarized circular divergent beam goes through the first λ/4 wave plate to produce a circularly polarized circular divergent beam;
      the circularly polarized circular divergent beam goes through the chip of the atomic vapor cell and the second λ/4 wave plate respectively to produce a second linearly polarized circular divergent beam;

the second linearly polarized circular divergent beam is reflected by the reflection device to produce a first linearly polarized reflected circular divergent beam;

the first linearly polarized reflected circular divergent beam goes through the lens to produce a first linearly polarized parallel beam;

the first linearly polarized parallel beam is reflected by the second polarizing beam splitter to produce a first linearly polarized reflected parallel beam;

the first linearly polarized reflected parallel beam is reflected by the first polarizing beam splitter and combined with the first linearly polarized circular divergent beam; and the first linearly polarized reflected parallel beam after being reflected by the first polarizing beam splitter goes through the first λ/4 wave plate, the chip of the atomic vapor cell, the second λ/4 wave plate, respectively, is reflected by the reflection device, goes through the lens, the second polarizing beam splitter, respectively, and is transmitted to the photo detector and converted into a current output.

2. The system of claim 1, wherein
the VCSEL device comprises: a capacitance, an inductance, and a VCSEL;
one end of the capacitance is used to input a microwave, and the other end of the capacitance is connected to an anode of the VCSEL;
one end of the inductance is used to input a current, and the other end of the inductance is connected to the anode of the VCSEL; and
a cathode of the VCSEL is electrically grounded.

3. The system of claim 1, wherein
the reflection device comprises: a first 45° reflection surface and a second 45° reflection surface;
the second linearly polarized circular divergent beam is reflected by the first 45° reflection surface to produce a second linearly polarized reflected circular divergent beam; and
the second linearly polarized reflected circular divergent beam is reflected by the second 45° reflection surface to produce the first linearly polarized reflected circular divergent beam.

4. The system of claim 3, wherein an incident angle of the second linearly polarized circular divergent beam is 45°; and the first 45° reflection surface is perpendicular to the second 45° reflection surface.

5. The system of claim 3, wherein
beam centers of the linearly polarized circular divergent beam, the first linearly polarized circular divergent beam, the circularly polarized circular divergent beam, and the second linearly polarized circular divergent beam overlap with each other;

both the second linearly polarized reflected circular divergent beam and the first linearly polarized reflected parallel beam are perpendicular to a transmission direction of the linearly polarized circular divergent beam; and the linearly polarized circular divergent beam, the first linearly polarized circular divergent beam, the circularly polarized circular divergent beam, the second linearly polarized circular divergent beam, the second linearly polarized reflected circular divergent beam, the first linearly polarized reflected circular divergent light, the first linearly polarized parallel beam, and the first linearly polarized reflected parallel beam are disposed on the same plane.

6. The system of claim 3, wherein
a transmission direction of the linearly polarized circular divergent beam is a positive direction of an X-axis;
an opposite direction of the positive direction of the X-axis is a negative direction of the X-axis;
both an inclined surface of the first polarizing beam splitter and the second 45° reflection surface are inclined by clockwise rotating the negative direction of the X-axis for 45°;
both an inclined surface of the second polarizing beam splitter and the first 45° reflection surface are inclined by counterclockwise rotating the positive direction of the X-axis for 45°;
a transmission direction of the second linearly polarized reflected circular divergent beam is a positive direction of a Y-axis;
an angle between an optical axis of the first λ/4 wave plate and the positive direction of the Y-axis is 45°; and
an optical axis of the second λ/4 wave plate is in parallel to the optical axis of the first λ/4 wave plate.

7. The system of claim 3, wherein
a total optical path of the first linearly polarized circular divergent beam, the circularly polarized circular divergent beam, the second linearly polarized circular divergent beam, the second linearly polarized reflected circular divergent beam, the first linearly polarized reflected circular divergent light, the first linearly polarized parallel beam, and the first linearly polarized reflected parallel beam is $$\frac{c}{2v_{00}},$$

in which, c represents a light velocity in vacuum, and $v_{00}$ represents a transition frequency between two atomic ground-state hyperfine Zeeman levels having magnetic quantum numbers equivalent to zero in the chip of the atomic vapor cell.

* * * * *